United States Patent Office 3,788,939

Patented Jan. 29, 1974

3,788,939

HIGH DIELECTRIC ELECTRONIC PACKAGING MATERIAL

Harold Daniel Dove, 11812 Daniel Ave., Garden Grove, Calif. 92640

No Drawing. Filed July 17, 1972, Ser. No. 272,695
Int. Cl. B32b 5/16
U.S. Cl. 161—93 6 Claims

ABSTRACT OF THE DISCLOSURE

Electronic interconnection and packaging materials must have electrical characteristics which match the electrical requirement of the total system if maximum performance is to be expected. Among the characteristics of the interconnection material is the dielectric constant of the insulating material. High dielectric constant insulating materials are desirable to provide a filtering function which is integral with the interconnection system. The present invention provides a new insulating material with a high dielectric constant for improved filter characteristics.

BACKGROUND OF THE INVENTION

In the design of electrical circuitry employed for the transmission of alternating current or controlled pulse current, it is generally desirable to transmit only the generated frequency current or a specific shaped pulse; however, as it is almost impossible to consider an electrical system completely isolated so that the generated signal maintains its initial frequency or shape. The passage of any electrical current through a conductor creates a magnetic field of its own which is coupled to any other magnetic field in the area, including that of earth and other solar bodies, which has an induced effect on the initial current to modify its instantaneous value. These stray, induced currents are generally known as noise or they appear as random, non-uniform static. The elimination or reduction of noise in electrical circuitry is obviously desirable and significant work has been performed in the field by way of circuit isolation and filter technique to provide accertable transmission reproducability. However, the size of the electronic circuitry has become so small that the relationship of the various component, including the transmission line, has created field effect problems of noise and cross-talk internally so that the only solution has been to approach the material characteristics of the components themselves.

The invention herein is related to improvement in the material of construction of transmission lines which are variously called interconnects, electronic packaging or circuit boards. For purposes of clarity, we shall refer to these elements as interconnects as they perform no other function, ideally, than the transfer of an electrical signal from point to point. The electrical characteristics with which this invention is concerned is that of the insulating material which divides the conductors from each other and provides a structural base for holding the conductor in place. As the conductors are generally in a planar mode in relationship to each other, that is, the interconnects are etched from a flat pattern of conductor to produce a printed circuit design and the planar conductors can be stacked in a series of sandwiches consisting of a conductor plane, a non-conductor or insulator plane, a conductor plane, an insulator plane, and so on, ad infinitum, within reasonable engineering thickness requirements. The planar relationship is indicative of a capacitor, one form of which is two planar metal sheets divided by a dielectric or non-conducting material. A capacitor has the ability to store any electrical charge. The amount of charge which a condenser can hold is determined by the formula $Q=CV$, where Q is the charge in coulombs, C is the capacity of the condenser in farads, and V is the voltage across the two plates; the capacity of a parallel plate condenser is $C=KA/4\pi d$, where K is the dielectric constant of the medium dividing the two plates, A is the area of the plates, and $d$ is the distance between them. K, the dielectric constant, is determined as follows:

$$K=\frac{4\pi d}{A}-C \qquad C=\frac{Q}{V} \qquad K=\frac{4\pi d}{AV}\cdot Q$$

If we take $d=1$ cm., $A=1$ sq. cm., and $V=$volt, K then equals $4\pi$Q. In other words, K is a characteristic of the material dividing the plates, which characteristic determines the capacity of a condenser to hold or take a charge. The larger the dielectric constant of the insulating material, the greater the capacity of the condenser; also, the larger the area, the greater the capacity; as miniaturization is the objective of most interconnect systems employed in the computer field, an increase in area to increase capacity is not acceptable; therefore, it is apparent that the only characteristic available to increase capacitance of a system is to increase the dielectric constant of the insulating material assuming the insulating material selected has the minimum thickness commensurate with structural requirements of the system.

The importance of the maximum capacitance in an interconnect system is apparent from the application of Krichoff's laws in which the capacitive reactance is expressed as a fuction of $1/Cf$ where C is the capacitance and $f$ is the frequency. As the frequency is fixed for a specific system, increasing the value of C decreases the capacitative reactance.

However, another characteristic of the insulating material is in its conformability to manufacture by conventional techniques. In the past, one of the most successful materials for fabricating interconnects has been the epoxy-fibre glass and polyester fibre glass insulators, clad on one or both sides with copper. The advantage of this system is that the copper could be etched to provide the desired conductor patterns and the insulator etched to provide a pattern to encase the copper connector and thereby provide a multilayer assembly with the conductors permanently located within the insulator. (See Stearns, U.S. No. 3,266,963, Method and Means for Etching Glass and Glass Reinforced Plastics.)

The tremendous advantage of this type of interconnect is its ease of manufacture and reliability; however, the size of the structure, i.e., the minimum size, is limited by the high coupling effect producing noise and cross-talk in circuits in the package not associated with the pulsed function circuit. The only significant variable that will improve this undesirable coupling effect is the dielectric constant of the insulator.

It is the purpose of this invention to provide a substitute for the epoxy-fibre glass and polyester fibre-glass insulators; retaining its desirable characteristic of etching by conventional means but having a significantly higher dielectric constant than the conventional material.

SUMMARY OF INVENTION

In the manufacture of electronic interconnects, it has been the normal procedure to use various insulating materials including papers, plastic and ceramics. In the computer field, it as been necessary to use those materials that have characteristics that not only provide insulation but also those which provide a high degree of conductor isolation to eliminate induced currents which cause noise and cross-talk which may be of sufficient magnitude to cause the false opening or closing of gates which would produce false data output from the computer circuit.

The only reliable technique for assurance of circuit isolation is the use of filters to eliminate stray currents and cross-talk.

As anyone skilled in the art knows, it is possible to employ various combinations of resistance, capacitance, and inductance to provide selective filtration for any specific frequency or spectrum of frequencies and generally the elements which provide the specific components of the filter are discrete elements which are incorporated into the electronic circuit at a specific juncture. As the manufacture of discrete element filters is expensive and adds to the bulk of the assembly, it has been found desirable to take advantage of the inherent electrical characteristics of the circuit components themselves to provide the resistors, capacitors, and inductors to produce the necessary filtration. It has been known for many years that when an alternating or variable voltage current is passed through a transmission line that the transmission line itself has present all of the elements of an electrical filter, i.e., resistance, capacitance, and induction; however, at low frequencies, the capacitance and inductance are so low as to be ignored as they relate to filter elements and extraneous elements are necessarily employed. As the size of the electronic element has decreased and as the frequency has increased, the inherent electrical characteristics have become important and it has been necessary to optimize the desirable characteristics to provide the most effective filtration and it is the purpose of this invention to improve the capacitor's characteristics of a specific system by increasing the dielectric characteristic of that system without materially reducing its structural characteristics.

It has been found that in the manufacture of conventional fibre-glass type insulating material in which the structural strength is imparted by a thermosetting plastic such as an epoxy or polyester, that the incorporation of a quantity of barium titanate in powder form into the plastic prior to application of the glass fibre will materially improve the dielectric properties of the resultant insulator without materially reducing the structural characteristics of the insulator and, equally as important, maintaining the etching characteristics of the epoxy as a polyester fibre-glass insulator in a commercial hydrofluoric-sulfuric etching system.

The following data has been compiled from the Plastic Encyclopedia, McGraw-Hill Publishing Co., New York, vol. 48, pp. 554–555, year 1971/1972, as contained in the "Plastics Properties Chart":

EPOXY RESIN (Dielectric constant)

| Number cycle | No fillers | Silica filled | Flexibilized (plasticizer) | Glass-fibre filled | Mineral filled |
|---|---|---|---|---|---|
| 60 | 3.5–5.0 | 3.2–4.5 | 3.0–6.0 | 3.5–5.0 | 3.5–3.0 |
| $10^3$ | 3.5–4.5 | 3.2–4.0 | 3.0–5.0 | 3.5–5.0 | 3.5–5.0 |
| $10^6$ | 3.3–4.0 | 3.0–3.8 | 3.0–6.0 | 3.5–5.0 | 3.5–5.0 |

At p. 562, the following data is disclosed as it relates to polyester (thermosetting):

| Number cycle | Cast-unfilled | Glass-woven | Asbestos-filled |
|---|---|---|---|
| 60 | 3.0–4.36 | 4.1–5.5 | ---- |
| $10^3$ | 2.9–5.2 | 4.2–6.0 | 5.2 |
| $10^6$ | 2.8–4.1 | 4.0–5.5 | 4.5 |

It is quite obvious from a perusal of these data that the fillers appear to have little influence upon the dielectric constant of the cured epoxy or polyester resin. It is the gist of my invention that I have found a composition which does produce a significant increase in the dielectric constant of an epoxy resin and polyester resin system. I have found that if barium titanate is employed as a filler with the glass the dielectric constant may be more than doubled with only a slight reduction in strength and without reducing materially the etching characteristics of the insulator.

As glass-filled epoxy resins are the standard insulating material for most interconnect systems, the evaluation of the product of this invention was principally on this material. The most convenient standard, and one recognized through the electronic industry. Specifications MIL–P–55617A, dated Aug. 12, 1970, issued by the U.S. Government Printing Office: 1970–433–689/8226, provided the technique employed in the evaluations. At p. 7, Table III, the dielectric constant of the glass-epoxy resin insulator has a maximum value of 5.4; both factors are measured at a frequency of 1 mHz. Further substantiations of these values is found in The Modern Plastics Encyclopedia, Vol. 48, M 10A, 1971–1972, McGraw-Hill Publishing Company at p. 555, lines 28, 29, and 30, under the column "Molding Compound, Glass Fibre Filled," which states that the dielectric constant of the epoxy resin, glass filled, is a value of 3.5–5.0 for all values of frequency between 60 Hz. to $10^6$ Hz.

For purposes of evaluation, two varieties of glass fabric were used which were designated as Clark-Schwebel style No. 108 and 116 which are equivalent to ASTM glass fabric designation 142 and 316, respectively. For purposes of clarity, the ASTM designations will be employed hereafter for reference purposes. The 142 style is a light-weight fabric having 23.3% by weight of glass and 76.7% resin-barium titanate; the 316 style is a heavy-weight glass comprising 35.6% by weight of glass fabric and 64.4% by weight of the epoxy-barium titanate.

LIGHT WEIGHT ELECTRICAL LAMINATING GLASS FABRICS

| | ASTM–type 142 | ASTM–type 316 |
|---|---|---|
| Oz./sq. yd | 1.44 | 3.16 |
| Thickness (in.) | .002 | .004 |
| Thread count: | | |
| Warp | 60 | 60 |
| Fill | 47 | 58 |
| Tensile strength: | | |
| Warp | 70 | 125 |
| Fill | 40 | 120 |
| Yarn: | | |
| Warp | 900½ | 900½ |
| Fill | 450½ | 450½ |
| Weave | Plain | Plain |

The resin employed in the evaluation was a shell epoxy resin system having the following characteristics: dielectric constant of 4.8; dissipation factor of .020 to .024; and a dielectric strength of 55, and cured with a tertiary amine such as TMBDA, curing agent. This is a standard epoxy resin used in laminates which meet Specification MIL–P–55617A. There are a large number of proprietary epoxy resins which meet this specification and would perform equally well.

The material employed in combination with the glass fabric and epoxy resin is barium titanate. The barium titanate employed in the initial test was a commercially pure product having 98% barium titanate; the principal impurities consisted of $SiO_2$, $Al_2O_3$, and $CO_2$, each in amounts of .050% or less. The barium titanate used has a bulk density of 120 lbs. per cubic foot and an average micron size of 1.37 with a maximum of .02% retained on a 325 mesh screen.

The results of the first evaluation is as follows:

DIELECTRIC CONSTANTS

| Percent by wt. $BaTiO^3$:resins | 23.3% by wt. ASTM–type 142 glass | 35.6% by wt. ASTM–type 316 glass |
|---|---|---|
| 15 | ---- | 6.0 |
| 25 | 8.0 | 8.3 |
| 35 | 8.9 | 8.6 |
| 45 | 9.7 | 9.0 |

These data indicate that 35% by weight of the barium titanate would almost double the dielectric constant. It was observed that at 45% barium titanate content to resin there was a significant reduction in strength when the sheets of cured insulator were flexed by hand. It was apparent that there was sufficient structural strength to produce an electrical interconnect but mixtures prepared with more than 45% barium titanate were not considered satisfactory and no further testing was performed upon them.

To evaluate a different particle size of barium titanate and aluminum oxide for dielectric constant increase, mixtures were evaluated at 35% content to resin ratio and with the ASTM–142 type glass fabric.

| Dielectric additive: | Dielectric constant |
|---|---|
| $Al_2O_3$ | 6.1 |
| $BaTiO_3$, 1.37 microns, | 8.9 |
| $BaTiO_3$, 1.96 microns | 7.8 |
| $BaTiO_3$, 2.14 microns | 7.5 |

It was concluded from these data that barium titanate is much more effective than aluminum oxide in the improvement in dielectric constant of the resulting insulator. Further, the smaller particle size barium titanate is more effective than the large particle size although all sizes tested were satisfactory for use as additive to epoxy-fibre glass to increase the dielectric constant.

All the specimens prepared were evaluated for etching characteristics in a mixture of sulfuric acid and hydrofluoric acid consisting of 70% $SO_3$, 12% HF, 18% $H_2O$ as defined by U.S. Pat. No. 3,266,963, Stearns. It was found that increasing the content of the barium titanate decreased the etch rate of the insulator. For instance, the 45% barium titanate content reduced the etch rate by a factor of about 50% which is acceptable from a production standpoint.

For purpose of comparison and because of the similar electrical characteristics, a specimen was prepared using a medium molecular weight, liquid polyester resin to which was added 35% by weight of barium titanate, which was then added to a square foot of ASTM–316 glass cloth, compressed and cured. The resultant product had a dielectric constant of 8.2 at 1000 cycles. The material without the barium titanate showed a dielectric constant of only 4.8.

The unexpectedly high dielectric constant of the barium titanate-epoxy resin fibre-glass mixture and polyester resin, fibre glass mixture provide a new engineering material having the desirable structural strength and etching characteristics of the conventional interconnect laminates and therefore I claim:

1. A dielectric material consisting of a fibre glass matrix encapsulated in a mixture consisting of barium titanate and a resin of the class consisting of polyester and epoxy.

2. The dielectric material of claim 1 in which the encapsulating mixture consists of about 15% to 45% barium titanate and about 55% to 85% resin.

3. The dielectric material of claim 1 in which the encapsulating mixture consists of about 35% barium titanate and the resin consists of about 65% epoxy.

4. The dielectric mixture of claim 1 in which the encapsulating mixture consists of about 35% barium titanate and the resin consists of about 65% polyester.

5. The dielectric material of claim 1 in which the fibre glass is in the form of woven glass fabric present in the amount of 20% to 35% by weight and the encapsulating mixture is present in the amount of 80% to 65% by weight of which 15% to 45% consists of barium titanate and 85% to 55% consists of resin.

6. The dielectric material of claim 5 having a dielectric constant of 6 to 10 in the cured state.

References Cited

UNITED STATES PATENTS

| | | | |
|---|---|---|---|
| 2,791,705 | 5/1957 | Vieweg | 252—63.5 UX |
| 3,121,656 | 2/1964 | Gluck | 161—93 |
| 3,231,799 | 1/1966 | Prokopowicz et al. | 252—63.2 |

WILLIAM J. VAN BALEN, Primary Examiner

U.S. Cl. X.R.

161—170, 185; 252—63.2, 63.5; 260—41 B, 41 AG